United States Patent [19]

De Leon

[11] 4,292,487
[45] Sep. 29, 1981

[54] METHOD FOR INITIATING THE FLOAT ZONE MELTING OF SEMICONDUCTORS

[75] Inventor: Noel De Leon, Frederikssund, Denmark

[73] Assignee: Topsil A/S, Frederikssund, Denmark

[21] Appl. No.: 128,997

[22] Filed: Mar. 10, 1980

Related U.S. Application Data

[63] Continuation of Ser. No. 904,105, May 8, 1978, abandoned.

[30] Foreign Application Priority Data

Jul. 7, 1977 [DK] Denmark .............................. 3063/77

[51] Int. Cl.³ .............................................. H05B 6/30
[52] U.S. Cl. ................................. 219/10.43; 219/10.77; 156/620
[58] Field of Search .............. 219/10.43, 10.77, 10.75, 219/10.49 R, 441, 482; 156/620, 617 R; 23/301 R

[56] References Cited

U.S. PATENT DOCUMENTS

| | | | |
|---|---|---|---|
| 2,916,593 | 12/1959 | Herrick | 219/10.43 |
| 3,046,379 | 7/1962 | Keller et al. | 219/10.43 |
| 3,064,109 | 11/1962 | Peschel | 219/10.77 |
| 3,198,929 | 8/1965 | Stut | 156/620 |
| 3,232,716 | 2/1966 | Quast | 156/620 |
| 3,265,470 | 8/1966 | Keller | 23/301 |
| 3,441,876 | 4/1969 | Zwanenburg | 219/10.77 |
| 3,567,895 | 3/1971 | Paz | 219/10.77 |
| 3,880,599 | 4/1975 | Keller | 156/620 |
| 4,032,740 | 6/1977 | Mittelmann | 219/10.77 |
| 4,078,168 | 3/1978 | Kelly | 219/482 X |
| 4,093,839 | 6/1978 | Moliterno et al. | 219/10.75 |

OTHER PUBLICATIONS

Keck et al., 'Floating Zone Recrystallization of Silicon', The Review of Scientific Instruments, vol. 25, No. 4, pp. 331–334, Apr. 1954.

*Primary Examiner*—Gene Z. Rubinson
*Assistant Examiner*—Philip H. Leung
*Attorney, Agent, or Firm*—John A. Fisher

[57] ABSTRACT

An improved method for initiating the inductive heating of semiconductors in the float zone refining process in which the oscillator circuit generating the required radio frequency energy is initially powered from a constant current source thereby controlling the rate of temperature rise for the semiconductor.

4 Claims, 3 Drawing Figures

METHOD FOR INITIATING THE FLOAT ZONE MELTING OF SEMICONDUCTORS

This is a continuation of application Ser. No. 904,105 filed May 8, 1978 now abandoned.

BACKGROUND OF THE INVENTION

This invention relates in general to float zone refining of semiconductor material and in particular to improvements in the initiation of the inductive heating process used for such refining.

In a typical apparatus for the float zone refining of semiconductor material such as silicon, induction heating using a radio frequency (RF) energy source is common. To heat silicon effectively by induction requires much higher frequency than for metal and thus inductive heating means are used which deliver energy at a frequency of from 1 to 10 megahertz. Typically, the RF energy is generated by the resonant circuit of a high power oscillator circuit and delivered to an induction heating coil which has a small enough coil diameter to produce a high induction field. High inductive fields are required because the resistivity of ultra-pure monocrystalline or polycrystalline silicon at room temperature is high and it is thus difficult to start the inductive heating. When inductive heating is initiated, the resistivity of the silicon decreases as the temperature increases. This has the effect of making the inductive heating progressively more effective since as more of the RF energy applied to the inductive heating coil is "coupled" into the semiconductor material being heated, the reduction in resistivity further enhances the coupling. The accelerated effect of this process continues until portions of the inductively heated silicon reach the melting point at which time there is a step function reduction in the resistivity of the silicon by a factor of more than 20. The corresponding sudden increase in coupling causes a very rapid temperature rise which in turn causes severe thermal shocks. The float zone refining process is typically initiated by positioning the pointed end of a relatively large diameter polycrystalline silicon feed rod in the center of an inductive heating coil and adjacent to a seed crystal. When inductive heating is initiated, the temperature of the pointed end of the feed rod quickly rises to the melting point while the remaining larger diameter portion of the feed rod stays relatively cool. The thermal shock associated with the large temperature differential between the pointed end and the bulk of the rod can create severe problems such as shattering of the polycrystalline feed rod.

SUMMARY OF THE INVENTION

Accordingly it is an object of this invention to provide an improved apparatus for the initiation of inductive heating in the float zone refining of semiconductor materials.

It is a further object of this invention to provide an improved apparatus and method whereby a constant current source is used to initially power the oscillator circuit which forms the source of inductive energy for a float zone refining apparatus.

Briefly described the present invention is an apparatus and method for the float zone melting of semiconductor rods in which a molten zone is formed in the rod by a surrounding inductive heater coil coupled to the resonant circuit of an oscillator which is in turn coupled to an electron control device whose power source is switchable and operates first in a constant current mode for coupling energy to said semiconductor rod to raise the temperature of said semiconductor rod to a temperature near but below its melting point and then operates in a constant voltage mode to further elevate the temperature of said semiconductor rod.

DETAILED DESCRIPTION

Figure 1:
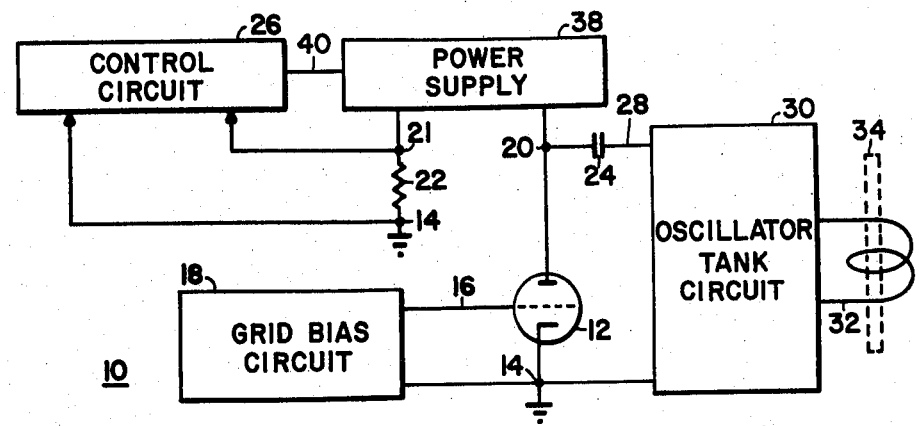
FIG. 1 shows a simplified circuit diagram illustrating the oscillator power arrangement of the present invention.

FIG. 1 illustrates a particular embodiment suitable for initiating the inductive heating of a semiconductor in a float zone refining process according to the present invention. In apparatus 10 shown in FIG. 1, a triode 12 provides the basic oscillating element for the circuit. The cathode of the triode 12 couples to a conductor 14 which is at ground potential for this particular embodiment. The grid of the triode 12 couples to a first terminal 16 of a grid bias circuit 18. A second terminal of the grid bias circuit 18 couples to the ground conductor 14. The anode of the triode 12 couples to a conductor 20 which couples to a first terminal of a capacitor 24 and which forms a first output of a power supply 38. A second output terminal of the power supply 38 couples to a conductor 21 which couples to a first terminal of a resistor 22 and which also couples to a first terminal of a control circuit 26. A second terminal of the resistor 22 couples to the ground conductor 14 and also to a second terminal of the control circuit 26. The second terminal of the capacitor 24 couples to a conductor 28 which forms a first input terminal of the oscillator tank circuit 30. A second input terminal of the oscillator tank circuit 30 couples to the ground conductor 14. The output of the oscillator tank circuit 30 is connected to an inductive heating coil 32 which is physically adapted to encompass a portion of a semiconductor material 34 which is to be inductively heated. The output of the control circuit 26 couples to the power supply 38 via a conductor 40.

Figure 2:
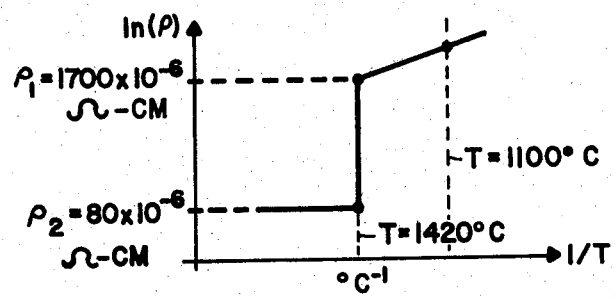
FIG. 2 shows a schematic graph illustrating the change in resistivity of silicon as a function of temperature.

In order to understand the apparatus and method of the present invention, the particular characteristics exhibited by semiconductor materials as they are heated must first be considered. FIG. 2 illustrates such characteristics for the case of silicon. FIG. 2 shows the relationship between the resistivity of silicon and its temperature in the form of an approximate graph which plots the natural logarithm of resistivity ($\rho$) against the reciprocal of temperature. As shown in FIG. 2, for temperatures below the melting point (such as T=1100° C.) the resistivity of silicon is a well behaved logarithmic function with resistivity decreasing as the temperature increases. At the melting point (T=1420° C.) the resistivity of silicon changes rapidly from an initial value of about $\rho_1 = 1700 \times 10^{-6}$ ohm-centimeters to a final value of about $\rho_2 = 80 \times 10^{-6}$ ohm-centimeters. This sharp drop in resistivity has a significant effect when an inductive heating apparatus such as that shown in FIG. 1 is used in the float zone melting of silicon. This effect comes about because the amount of RF energy which is coupled from the inductive heating coil 32 into the semiconductor material 34 is inversely proportional to the resistivity of the semiconductor material 34. Thus, as various regions or layers of the semiconductor material reach the melting point, the step function decrease in resistivity causes a corresponding increase in the effective rate at which energy is coupled into the material to further facilitate the melting. When the energy available for coupling is not limited, the accelerated effect caused by the onset of localized melting results in very rapid melting of the "zone" encompassed by the inductive heating element 32.

Figure 3:
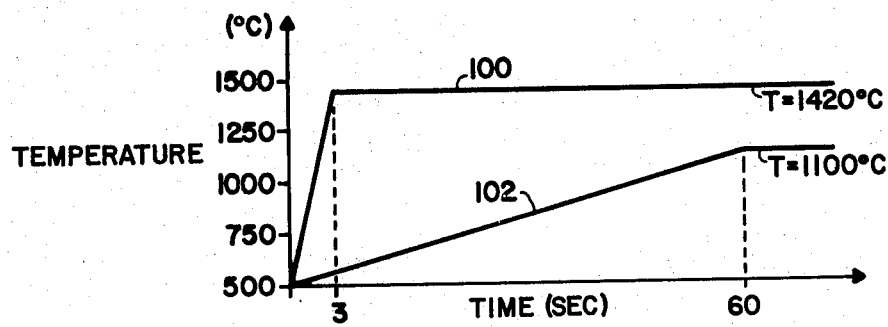
FIG. 3 shows comparative graphs illustrating the rates of temperatures increase for alternative methods of inductively heating silicon.

FIG. 3 illustrates the accelerated effect in temperature characteristic 100 which shows the heating effect obtained with the apparatus of FIG. 1 when the power supply 38 is operated in a constant voltage mode. In the constant voltage mode, the only limiting effect on the energy produced by the oscillation of the power oscillator triode 12 which couples to the inductive heating coil 32 via the oscillator tank circuit 30 is the final impedance of the system as determined by the resistivity of the semiconductor material 34. Thus, as shown in FIG. 3, the accelerating effect associated with the onset of the melting of silicon causes the formation of a molten zone in a very short time (approximately 3 seconds for the temperature characteristic 100).

As previously discussed this very rapid heating creates severe thermal shocks which can create problems in the delicate physical arrangements often used in float zone refining operations. One example is the arrangement by which a seed crystal is joined with the molten end of a polycrystalline silicon rod to initiate a process whereby a larger diameter monocrystalline work piece is grown. The thermal shocks associated with the initiation of inductive heating using a constant voltage mode power source as illustrated by the temperature characteristic 100 of FIG. 3 can create severe problems such as the shattering of the relatively fragile feed rod.

FIG. 3 also illustrates a second temperature characteristic 102 which demonstrates a much more gradual rate of temperature increase with respect to time. This characteristic results from first operating the apparatus of FIG. 1 in a current limited or constant current mode. In such a mode of operation, as the onset of melting in the semiconductor material 34 reduces resistivity and increases "coupling", the amount of RF energy transferred is regulated by limiting the current delivered to the anode of the power oscillator triode 12 at a constant value. The apparatus of FIG. 1 illustrates one particular way to accomplish this current limiting through the use of the sensing resistor 22 which couples between the second output conductor 21 of the power supply 38 and the ground conductor 14. Conductor 21 and the ground conductor 14 couple to the control circuit 26 such that when the anode current delivered to the triode 12 reaches the prescribed limiting value, the voltage developed across the sensing resistor 22 and coupled to the control circuit 26 will produce a control signal which is transmitted to the power supply 38 via the conductor 40. The control signal on the conductor 40 regulates the internal operation of the power supply 38 in a well known manner to provide the proper voltage on the output conductor 36 as required to maintain the constant current value to the anode of the power triode 12. Characteristic 102 shown in FIG. 3 illustrates one particular mode of operation for the apparatus of FIG. 1 in which the current delivered to the anode of the triode 12 is constrained to be, for example, in the range 1 to 1.5 amperes. With this current limit, there is a controlled rate of energy transferred to the inductive heating coil 32 such that the rise in temperature of the semiconductor material 34 occurs slowly and regularly and preferably takes approximately one minute or more to increase from 500° C. to a plateau temperature of about 1100° C. as shown by characteristic 102 in FIG. 3. This mode of initiation of inductive heating eliminates the thermal shock problems discussed above and is thus a much more desired method of operation. Once a stable plateau temperature has been achieved, the operation of the apparatus shown in FIG. 1 can be changed such that the power supply 38 operates in a constant voltage mode as is typical for the float zone refining of semiconductors. This change in operating mode can either be accomplished manually or via further actions of the control circuit 26.

What is claimed is:

1. An improved method for initiating the float zone melting of semiconductor material using an apparatus which includes an induction heating coil for heating said semiconductor material, said induction heating coil being driven from an oscillator including a triode and having a switchable energy source, the improvement comprising the steps of: delivering current from said energy source to the anode of said triode to transfer energy to said inductive heating coil; maintaining said current to said anode constant to effect a controlled slow rate of induction heating of said semiconductor material to a first temperature below its melting temperature, said slow rate of induction heating reducing thermal shock to said semiconductor material; and subsequently switching said energy source to a constant voltage mode to induction heat said semiconductor material to a second temperature higher than said first temperature.

2. The improved method of claim 1 wherein said semiconductor material is silicon.

3. The improved method of claim 2 wherein the first temperature is about 1100° C.

4. The improved method of claim 1 further comprising monitoring the voltage drop in a resistor in series with said anode during said step of maintaining said anode current constant.

* * * * *